(12) United States Patent
Waldmann et al.

(10) Patent No.: US 9,543,171 B2
(45) Date of Patent: Jan. 10, 2017

(54) AUTO-CORRECTION OF MALFUNCTIONING THERMAL CONTROL ELEMENT IN A TEMPERATURE CONTROL PLATE OF A SEMICONDUCTOR SUBSTRATE SUPPORT ASSEMBLY THAT INCLUDES DEACTIVATING THE MALFUNCTIONING THERMAL CONTROL ELEMENT AND MODIFYING A POWER LEVEL OF AT LEAST ONE FUNCTIONING THERMAL CONTROL ELEMENT

(71) Applicant: Lam Research Corporation, Fremont, CA (US)

(72) Inventors: Ole Waldmann, Oakland, CA (US); Eric A. Pape, Campbell, CA (US); Keith William Gaff, Fremont, CA (US); Harmeet Singh, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 326 days.

(21) Appl. No.: 14/307,062

(22) Filed: Jun. 17, 2014

(65) Prior Publication Data
US 2015/0364388 A1 Dec. 17, 2015

(51) Int. Cl.
*H01L 21/00* (2006.01)
*H01L 21/67* (2006.01)

(52) U.S. Cl.
CPC ... *H01L 21/67109* (2013.01); *H01L 21/67248* (2013.01); *H01L 21/67288* (2013.01)

(58) Field of Classification Search
CPC .................................. H01L 21/66; H05B 3/68
USPC .......................................................... 438/14
See application file for complete search history.

(56) References Cited

U.S. PATENT DOCUMENTS

| | | | |
|---|---|---|---|
| 3,440,883 | A | 4/1969 | Lightner |
| 3,752,956 | A | 8/1973 | Cahill et al. |
| 5,255,520 | A | 10/1993 | O'Geary et al. |
| 5,504,471 | A | 4/1996 | Lund |
| 5,515,683 | A | 5/1996 | Kessler |
| 5,591,269 | A | 1/1997 | Arami et al. |
| 5,698,029 | A * | 12/1997 | Fujikawa .............. C30B 11/002 117/200 |

(Continued)

FOREIGN PATENT DOCUMENTS

| | | |
|---|---|---|
| JP | 2005-123286 | 5/2005 |
| JP | A-2008-288480 | 11/2008 |

(Continued)

*Primary Examiner* — Caleb Henry

(57) ABSTRACT

A method for auto-correction of at least one malfunctioning thermal control element among an array of thermal control elements that are independently controllable and located in a temperature control plate of a substrate support assembly which supports a semiconductor substrate during processing thereof, the method including: detecting, by a control unit including a processor, that at least one thermal control element of the array of thermal control elements is malfunctioning; deactivating, by the control unit, the at least one malfunctioning thermal control element; and modifying, by the control unit, a power level of at least one functioning thermal control element in the temperature control plate to minimize impact of the malfunctioning thermal control element on the desired temperature output at the location of the at least one malfunctioning thermal control element.

22 Claims, 9 Drawing Sheets

(56) References Cited

U.S. PATENT DOCUMENTS

| | | |
|---|---|---|
| 5,702,624 A | 12/1997 | Liao et al. |
| 5,994,675 A | 11/1999 | Bethune et al. |
| 6,060,697 A | 5/2000 | Morita et al. |
| 6,091,060 A | 7/2000 | Getchel et al. |
| 6,100,506 A | 8/2000 | Colelli, Jr. et al. |
| 6,469,283 B1 | 10/2002 | Burkhart et al. |
| 6,483,690 B1 | 11/2002 | Nakajima et al. |
| 6,612,673 B1 | 9/2003 | Giere et al. |
| 6,664,515 B2 | 12/2003 | Natsuhara et al. |
| 6,693,262 B2 | 2/2004 | Gerola et al. |
| 6,700,101 B2 | 3/2004 | Decesari et al. |
| 6,741,446 B2 | 5/2004 | Ennis |
| 6,847,014 B1* | 1/2005 | Benjamin ......... H01L 21/67248 219/444.1 |
| 6,913,571 B2 | 7/2005 | Severns |
| 6,921,724 B2* | 7/2005 | Kamp ............... H01L 21/31116 156/345.52 |
| 6,985,000 B2 | 1/2006 | Feder et al. |
| 6,989,210 B2 | 1/2006 | Gore |
| 7,175,714 B2 | 2/2007 | Ootsuka et al. |
| 7,250,309 B2 | 7/2007 | Mak et al. |
| 7,275,309 B2 | 10/2007 | Matsuda et al. |
| 7,279,661 B2 | 10/2007 | Okajima et al. |
| 7,396,431 B2 | 7/2008 | Chen et al. |
| 7,415,312 B2 | 8/2008 | Barnett, Jr. et al. |
| 7,782,583 B2 | 8/2010 | Moon |
| 7,940,064 B2 | 5/2011 | Segawa et al. |
| 7,968,825 B2 | 6/2011 | Jyousaka et al. |
| 8,057,602 B2 | 11/2011 | Koelmel et al. |
| 8,222,574 B2 | 7/2012 | Sorabji et al. |
| 8,461,674 B2 | 6/2013 | Gaff et al. |
| 8,587,113 B2 | 11/2013 | Gaff et al. |
| 8,624,168 B2 | 1/2014 | Gaff et al. |
| 8,637,794 B2* | 1/2014 | Singh .................... C23C 14/541 219/483 |
| 8,642,480 B2 | 2/2014 | Gaff et al. |
| 8,884,194 B2* | 11/2014 | Singh .................... C23C 14/541 219/444.1 |
| 2002/0063121 A1* | 5/2002 | Mokuo ............. G05D 23/1909 219/481 |
| 2003/0044621 A1* | 3/2003 | Won ...................... C23C 16/401 428/446 |
| 2003/0161552 A1* | 8/2003 | Shima ..................... B41J 11/002 382/312 |
| 2005/0217799 A1* | 10/2005 | O'Meara ........... H01L 21/67109 156/345.52 |
| 2006/0083495 A1* | 4/2006 | Taiquing ............. F27B 17/0025 392/416 |
| 2006/0226123 A1 | 10/2006 | Birang |
| 2007/0090516 A1* | 4/2007 | White ................. C23C 16/4586 257/704 |
| 2007/0125762 A1 | 6/2007 | Cui et al. |
| 2008/0035306 A1* | 2/2008 | White ................. C23C 16/4586 165/61 |
| 2008/0049374 A1 | 2/2008 | Morioka et al. |
| 2009/0183677 A1 | 7/2009 | Tian et al. |
| 2009/0215201 A1 | 8/2009 | Benjamin et al. |
| 2010/0116788 A1 | 5/2010 | Singh et al. |
| 2010/0283565 A1 | 11/2010 | Blakes |
| 2011/0005682 A1 | 1/2011 | Savas et al. |
| 2011/0033175 A1 | 2/2011 | Kasai et al. |
| 2011/0092072 A1* | 4/2011 | Singh .................... C23C 14/541 438/710 |
| 2011/0143462 A1* | 6/2011 | Gaff .................. H01L 21/67248 438/9 |
| 2011/0255848 A1 | 10/2011 | Ji et al. |
| 2012/0068750 A1 | 3/2012 | McCoy |
| 2012/0097661 A1* | 4/2012 | Singh ............... H01L 21/67109 219/446.1 |
| 2012/0115254 A1 | 5/2012 | Singh |
| 2012/0299253 A1* | 11/2012 | Kosakai ........... H01L 21/67103 279/128 |
| 2013/0068750 A1* | 3/2013 | Gaff ................. H01L 21/67109 219/444.1 |
| 2013/0072025 A1 | 3/2013 | Singh et al. |
| 2013/0072035 A1 | 3/2013 | Gaff et al. |
| 2013/0098895 A1 | 4/2013 | Swanson et al. |
| 2013/0105457 A1 | 5/2013 | Swanson et al. |
| 2013/0105462 A1 | 5/2013 | Schmidt et al. |
| 2013/0105463 A1 | 5/2013 | Schmidt et al. |
| 2013/0105465 A1 | 5/2013 | Swanson et al. |
| 2013/0161305 A1* | 6/2013 | Ptasienski ................ H05B 3/20 219/201 |
| 2013/0220575 A1 | 8/2013 | Ptasienski et al. |
| 2013/0220989 A1* | 8/2013 | Pease .................. H01L 21/6831 219/458.1 |
| 2013/0228548 A1 | 9/2013 | Ptasienski et al. |
| 2013/0269368 A1 | 10/2013 | Gaff et al. |
| 2013/0270250 A1 | 10/2013 | Pease et al. |
| 2014/0004702 A1 | 1/2014 | Singh |
| 2014/0045337 A1* | 2/2014 | Singh .................... C23C 14/541 438/710 |
| 2014/0047705 A1* | 2/2014 | Singh .................... C23C 14/541 29/611 |
| 2014/0048529 A1 | 2/2014 | Pease |
| 2014/0096909 A1* | 4/2014 | Singh .................... C23C 14/541 156/345.52 |
| 2014/0110060 A1 | 4/2014 | Gaff et al. |
| 2014/0154819 A1* | 6/2014 | Gaff ................. H01L 21/67109 438/17 |
| 2014/0220709 A1 | 8/2014 | Kimura et al. |
| 2014/0356985 A1* | 12/2014 | Ricci ............... H01L 21/67109 438/11 |
| 2015/0055940 A1* | 2/2015 | Steinhauser ........ H01L 21/6831 392/307 |
| 2015/0170977 A1* | 6/2015 | Singh ............... H01L 21/67248 438/16 |
| 2015/0219499 A1 | 8/2015 | Waldmann et al. |
| 2016/0111315 A1* | 4/2016 | Parkhe ............. H01L 21/67103 361/234 |

FOREIGN PATENT DOCUMENTS

| | | |
|---|---|---|
| JP | 2009/532877 | 9/2009 |
| KR | 10-2008-0058109 | 6/2008 |
| WO | WO2010/064813 A2 | 6/2010 |
| WO | WO 2011/081645 A2 | 7/2011 |
| WO | WO 2012/054198 A2 | 4/2012 |

* cited by examiner

Without Compensation

|  | Min. [a.u.] | Mean [a.u.] | Max. [a.u.] | σ [a.u.] |
|---|---|---|---|---|
| No Failure | 0.75 | 0.82 | 0.89 | 0.01 |
| Edge TCE Failure | 0.00 | 0.80 | 0.88 | 0.08 |
| Mid TCE Failure | 0.33 | 0.80 | 0.89 | 0.05 |
| Center TCE Failure | 0.50 | 0.81 | 0.89 | 0.04 |

FIG. 5A

With Compensation

|  | Min. [a.u.] | Mean [a.u.] | Max. [a.u.] | σ [a.u.] |
|---|---|---|---|---|
| No Failure | 0.75 | 0.82 | 0.89 | 0.01 |
| Edge TCE Failure | 0.45 | 0.81 | 1.00 | 0.02 |
| Mid TCE Failure | 0.62 | 0.83 | 0.92 | 0.02 |
| Center TCE Failure | 0.71 | 0.83 | 0.89 | 0.01 |

FIG. 5B

3-Dimensional
Size: m*n*k

2-Dimensional
Size: (m*n)*k

AUTO-CORRECTION OF MALFUNCTIONING THERMAL CONTROL ELEMENT IN A TEMPERATURE CONTROL PLATE OF A SEMICONDUCTOR SUBSTRATE SUPPORT ASSEMBLY THAT INCLUDES DEACTIVATING THE MALFUNCTIONING THERMAL CONTROL ELEMENT AND MODIFYING A POWER LEVEL OF AT LEAST ONE FUNCTIONING THERMAL CONTROL ELEMENT

BACKGROUND

With each successive semiconductor technology generation, substrate diameters tend to increase and transistor sizes decrease, resulting in the need for an ever higher degree of accuracy and repeatability in substrate processing.

Plasma processing systems available today are among those semiconductor fabrication tools which are subject to an increasing need for improved accuracy and repeatability. One metric for plasma processing systems is increased uniformity, which includes uniformity of process results on a semiconductor substrate surface as well as uniformity of process results of a succession of substrates processed with nominally the same input parameters. Continuous improvement of on-substrate uniformity is desirable. Among other things, this calls for plasma chambers with improved uniformity, consistency and self-diagnostics. Controlling the temperature of a substrate support assembly during etch and/or deposition process of a semiconductor chip wafer is critical to control the yield of devices from a wafer.

SUMMARY

According to one embodiment, a method for auto-correction of at least one malfunctioning thermal control element among an array of thermal control elements that are independently controllable and located in a temperature control plate of a substrate support assembly which supports a semiconductor substrate during processing thereof, comprises: detecting, by a control unit including a processor, that at least one thermal control element of the array of thermal control elements is malfunctioning; deactivating, by the control unit, the at least one malfunctioning thermal control element; and modifying, by the control unit, a power level of at least one functioning thermal control element in the temperature control plate to minimize impact of the malfunctioning thermal control element on the desired temperature output at the location of the at least one malfunctioning thermal control element.

According to another embodiment, a non-transitory computer readable storage medium, storing instructions, which when executed by a processor, performs a method of performing auto-correction for at least one malfunctioning thermal control element among an array of thermal control elements that are independently controllable and located in a temperature control plate of a substrate support assembly which supports a semiconductor substrate during processing thereof. The instructions cause the following steps to be carried out: (1) detecting that at least one thermal control element of the array of thermal control elements is malfunctioning; (2) deactivating the at least one malfunctioning thermal control element; and (3) modifying a power level of at least one functioning thermal control element in the electrostatic chuck to minimize impact of the malfunctioning thermal control element on the desired temperature output at the location of the at least one malfunctioning thermal control element.

According to a further embodiment, a method for auto-correction of at least one malfunctioning thermal control element among an array of thermal control elements that are independently controllable and located in a temperature control plate of a substrate support assembly which supports a semiconductor substrate during processing thereof, comprises: detecting, by a control unit including a processor, that at least one thermal control element of the array of thermal control elements is malfunctioning; deactivating, by the control unit, the at least one malfunctioning thermal control element; and maintaining, by the control unit, power levels of all functioning thermal control elements in the temperature control plate to minimize impact of the malfunctioning thermal control element on the desired temperature output at the location of the at least one malfunctioning thermal control element.

These and other exemplary features and advantages of particular embodiments of the method for auto-correction of at least one malfunctioning thermal control element among an array of thermal control elements will now be described by way of exemplary embodiments to which they are not limited.

BRIEF DESCRIPTION OF THE DRAWINGS

The scope of the present disclosure is best understood from the following detailed description of exemplary embodiments when read in conjunction with the accompanying drawings. Included in the drawings are the following figures:

FIG. 5A is an exemplary table containing temperature data associated with defective thermal control elements when compensation is not performed.

FIG. 5B is an exemplary table containing temperature data associated with defective thermal control elements when compensation is performed.

Further areas of applicability of the present disclosure will become apparent from the detailed description provided hereinafter. It should be understood that the detailed description of exemplary embodiments are intended for illustration purposes only and are, therefore, not intended to necessarily limit the scope of the disclosure.

DETAILED DESCRIPTION

Figure 1:
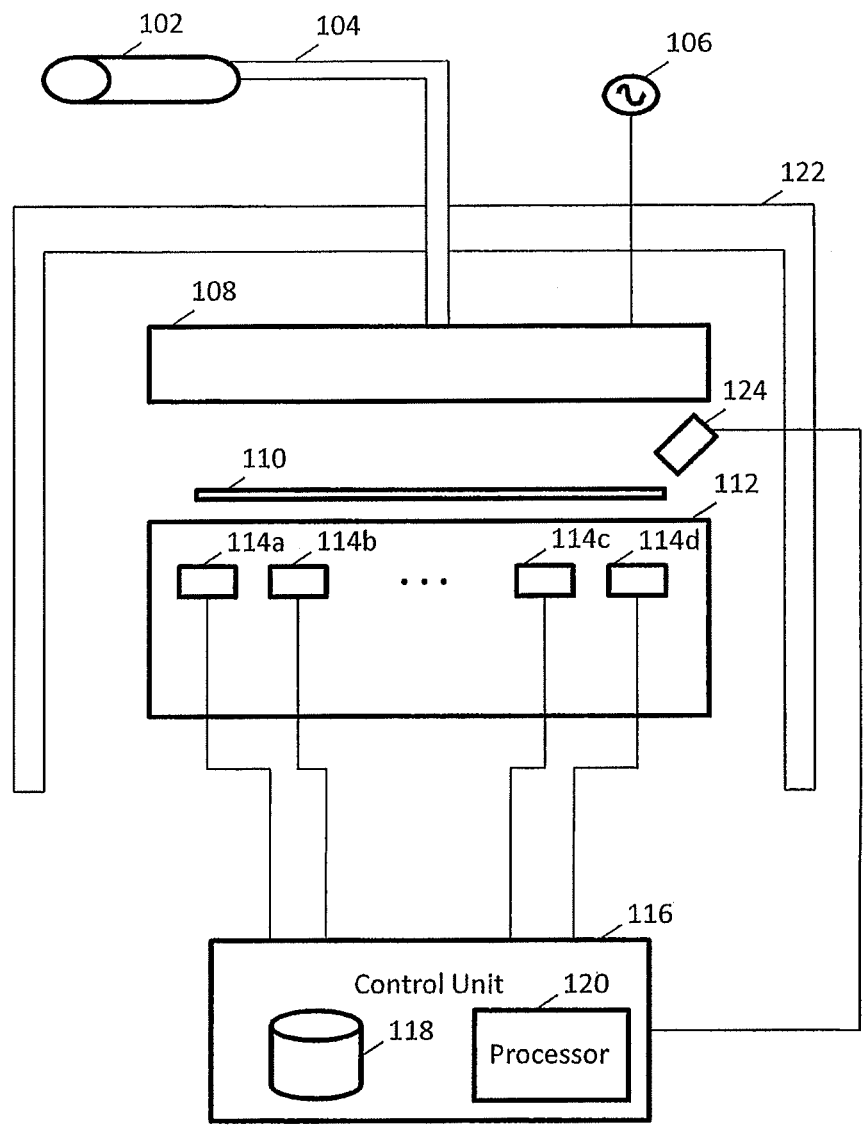
FIG. 1 illustrates a system architecture that may be employed in accordance with an exemplary embodiment.

FIG. 1 shows an exemplary schematic of a plasma processing chamber including a chamber 122 having an upper showerhead electrode 108 and a substrate support assembly 112 incorporating a heating plate. The substrate support assembly 112 is also called a chuck or an electrostatic chuck (ESC). A substrate 110 is loaded through a loading port (not shown) onto the substrate support assembly 112. A gas line 104 supplies process gas to the upper showerhead electrode 108 which delivers the process gas into the chamber. A gas source 102 (e.g. a mass flow controller supplying a suitable gas mixture) is connected to the gas line 104. A radio-frequency (RF) power source 106 is connected to the upper showerhead electrode 108. In operation, the chamber is evacuated by a vacuum pump and the RF power is capacitively coupled between the upper showerhead electrode 108 and a lower electrode in the substrate support assembly 112 to energize the process gas into a plasma in the space between the substrate 110 and the upper showerhead electrode 108. The plasma can be used to etch device die features into layers on the substrate 110. The substrate support assembly 112 may include at least one thermal control element (TCE) 114 (114a, 114b, 114c, 114d, etc.) that can heat the substrate support assembly 112 to desired temperatures. In a non-limiting embodiment, the substrate support assembly 112 includes die-by-die thermal control elements to control the substrate support assembly surface temperature with a high spatial resolution. The power output of a particular thermal control element 114 is calculated and optimized by a given temperature demand, and the relationship between the power output and the temperature is given by a matrix, e.g., a unit response matrix (URM) which will be discussed in greater detail later.

Each thermal control element 114 is connected to a control unit 116, which includes a storage device 118 for storing data, such as a hard drive, read-only memory (ROM), random-access memory (RAM), optical drive, flash memory, magnetic tape drive, etc. A chamber 122 can be used that does not have RF/power control, etc.

The control unit 116 can also include a processor device 120 such as a computer processor. Instead of one control unit 116, multiple control units can be used. The control unit 116 may be implemented as computer-readable code compiled on a computer, thus making it a specific purpose computer. For example, the control unit 116 may be implemented in a computer system using hardware, software, firmware, non-transitory computer readable media having instructions stored thereon, or a combination thereof, and may be implemented in one or more computer systems or other processing systems. Hardware, software, or any combination thereof may embody modules and components used to implement the exemplary methods of FIGS. 6 and 9.

If programmable logic is used, such logic may execute on a commercially available processing platform or a special purpose device. A person having ordinary skill in the art may appreciate that embodiments disclosed herein can be practiced with various computer system configurations, including multi-core multiprocessor systems, minicomputers, mainframe computers, computers linked or clustered with distributed functions, as well as pervasive or miniature computers that may be embedded into virtually any device. For instance, at least one processor device and a memory may be used to implement the above described embodiments.

A processor device as discussed herein may be a single processor, a plurality of processors, or combinations thereof. Processor devices may have one or more processor "cores." The terms "computer program medium," "non-transitory computer readable medium," and "computer usable medium" as discussed herein are used to generally refer to tangible media such as a removable storage unit or a hard disk installed in hard disk drive.

Various embodiments are described in terms of an exemplary control unit 116. After reading this description, it will become apparent to a person skilled in the relevant art how to implement such embodiments using other computer systems and/or computer architectures. Although operations may be described as a sequential process, some of the operations may in fact be performed in parallel, concurrently, and/or in a distributed environment, and with program code stored locally or remotely for access by single or multi-processor machines. In addition, in some embodiments the order of operations may be rearranged.

Processor device 120 may be a special purpose or a general purpose processor device. The processor device 120 may be connected to a communication infrastructure, such as a bus, message queue, network, multi-core message-passing scheme, etc. The network may be any network suitable for performing the functions as disclosed herein and may include a local area network (LAN), a wide area network (WAN), a wireless network (e.g., WiFi), a mobile communication network, a satellite network, the Internet, fiber optic, coaxial cable, infrared, radio frequency (RF), or any combination thereof. Other suitable network types and configurations will be apparent to persons having skill in the relevant art.

It should be appreciated that while the detailed design of the plasma processing chamber may vary (for example, the chamber can be an inductively coupled plasma processing chamber, helicon, microwave, or other type chamber, the showerhead electrode would be replaced with an RF antenna), RF power is coupled to the plasma through the substrate support assembly 112.

In an exemplary embodiment, the substrate support assembly 112 can be controlled so that the substrate support assembly surface temperature, and therefore the wafer substrate 110 temperature, is controlled by an array of thermal control elements 114. For example, the array can include any number of thermal control elements 114, e.g., at least 50, up to 400, etc. In an exemplary embodiment, each of the thermal control elements 114 can be similar size to that of the device dies on the wafer so that the wafer temperature, and consequently the plasma etch process, deposition, or clean process can be controlled for each device die position to maximize the yield of devices from a wafer. The deposition processes can be, for example, chemical vapor deposition (CVD), plasma enhanced chemical vapor based deposition (PECVD), vapor phase epitaxy (VPE), physical vapor deposition (PVD), electrochemical deposition (ECD), molecular beam epitaxy (MBE), atomic layer deposition (ALD), etc. The cleaning processes can be, for example, plasma stripping, plasma cleaning, chemical etching, chemical cleaning, wet cleaning, etc.

The thermal control elements 114 can be the sole thermal control element in the substrate support assembly 112, or can be part of a temperature regulation system with multiple components, such as more or different thermal control elements, coolant fluid, and/or coolant gas. The thermal control elements 114 can be, for example, resistive elements, such as polyimide thermal control elements, silicone rubber, mica thermal control elements, metal thermal control elements (e.g., W, Ni/Cr alloy, Mo or Ta), ceramic thermal control elements, semiconductor thermal control elements, carbon thermal control elements, Peltier devices that can both heat or cool, or any other element that can vary temperature.

In an exemplary embodiment, a temperature detector 124, for example an infrared camera, detects the surface temperature of the substrate support assembly 112, and/or wafer substrate 110. The risk of failure of one or multiple thermal control elements 114 in the substrate support assembly 112 increases as the number of thermal control elements 114 increases.

In an exemplary embodiment, the control unit 116 or another controller creates/executes an algorithm that performs auto-correction of at least one malfunctioning (e.g., abnormally performing or failed) thermal control element 114 among an array of thermal control elements that are independently controllable as described in the exemplary embodiments. An advantageous feature of the auto-correction method is the reduction in the cost of ownership of a substrate support assembly 112 when a thermal control element 114 has failed. Auto-correction enables a substrate support assembly 112 with a reduced number of working thermal control elements 114 to still be within the specification of targeted temperature profiles. The cost reduction is caused by two factors; the first factor is the reduction in the cost of hardware (i.e., the cost of buying a new substrate support assembly 112) and the cost of not running the processing chamber while the substrate support assembly 112 is being replaced. Also, automating the full process of detecting the failure and modifying the parameters prevents the introduction of a human source of error.

Figure 2:
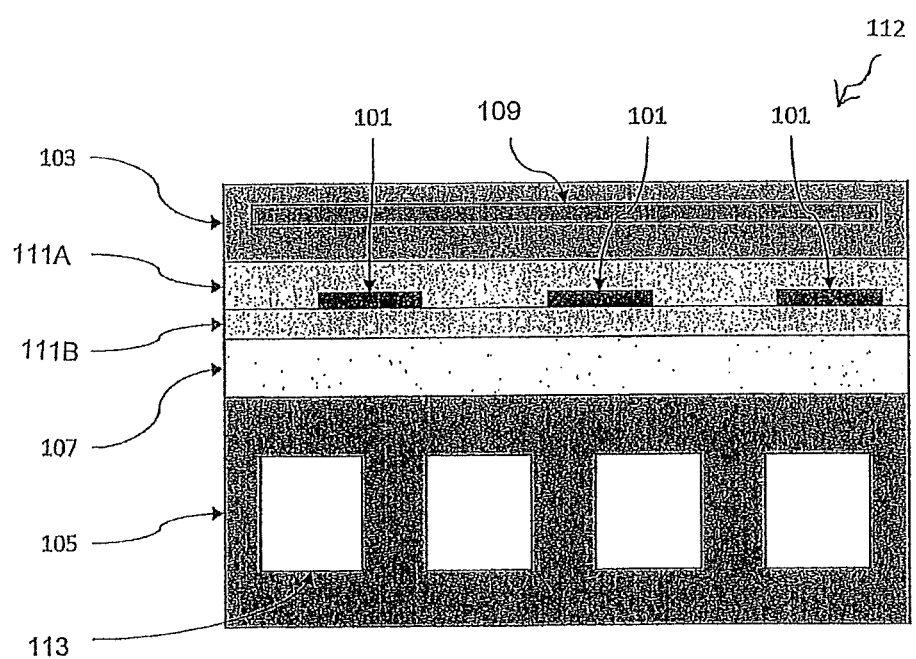
FIG. 2 illustrates a substrate support assembly used in an exemplary embodiment.

FIG. 2 shows a substrate support assembly 112 comprising one embodiment of the temperature control plate having an array of planar thermal zones 101 incorporated in two electrically insulating layers 111A and 111B. Each planar thermal zone 101 can include one or more thermal control elements 114. The electrically insulating layers may be a polymer material, an inorganic material, a ceramic such as silicon oxide, alumina, yttria, aluminum nitride or other suitable material. The substrate support assembly 112 further comprises (a) an electrostatic chuck having a ceramic layer 103 (electrostatic clamping layer) in which an electrode 109 (e.g. monopolar or bipolar) is embedded to electrostatically clamp a substrate to the surface of the ceramic layer 103 with a DC or AC voltage, (b) a thermal barrier layer 107, (c) a cooling plate 105 containing channels 113 for coolant flow.

In an exemplary embodiment, each of the planar thermal zones 101 is connected to a power supply line and a power return line. No two planar thermal zones 101 share the same pair of power supply line and power return line. By suitable electrical switching arrangements, it is possible to connect a pair of power supply and power return lines to a power supply, whereby only the planar thermal zone 101 connected to this pair of lines is turned on. The time-averaged heating/cooling power of each planar thermal zone 101 can be individually tuned by switching the system on and off in a time controlled manner.

A substrate support assembly 112 can comprise an embodiment of the temperature control plate, wherein each planar thermal zone 101 of the temperature control plate is of similar size to or smaller than a single device die or group of device dies on the substrate so that the substrate temperature, and consequently the plasma etching process, can be controlled for each device die position to maximize the yield of devices from the substrate. The temperature control plate can include 10-100, 100-200, 200-300 or more planar thermal zones 101. The scalable architecture of the temperature control plate can readily accommodate the number of planar thermal zones required for die-by-die substrate temperature control (typically more than 100 dies on a substrate of 300 mm diameter and thus 100 or more thermal zones) with minimal number of power supply lines, power return lines, and feedthroughs in the cooling plate 105, thus reducing disturbance to the substrate temperature, the cost of manufacturing, and the complexity of the substrate support assembly 112. Although not shown, the substrate support assembly 112 can comprise features such as lift pins for lifting the substrate 110, helium back cooling, temperature sensors for providing temperature feedback signals, voltage and current sensors for providing heating power feedback signals, power feed for thermal control elements 114 and/or clamp electrode, and/or RF filters.

Figure 3A:
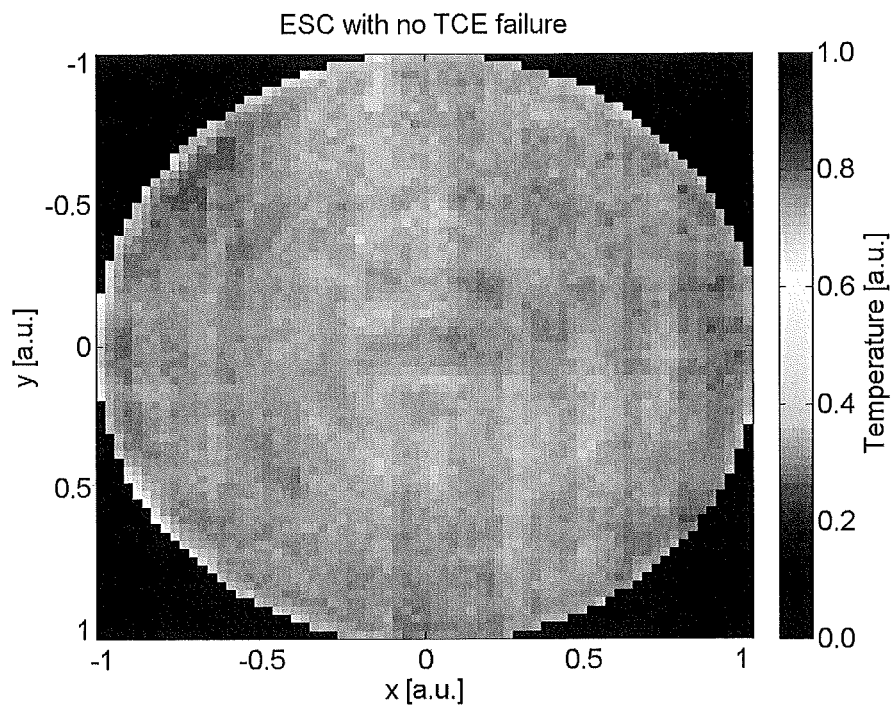
FIGS. 3A-C are thermal images of a substrate support assembly used in an exemplary embodiment.
Figure 3B:
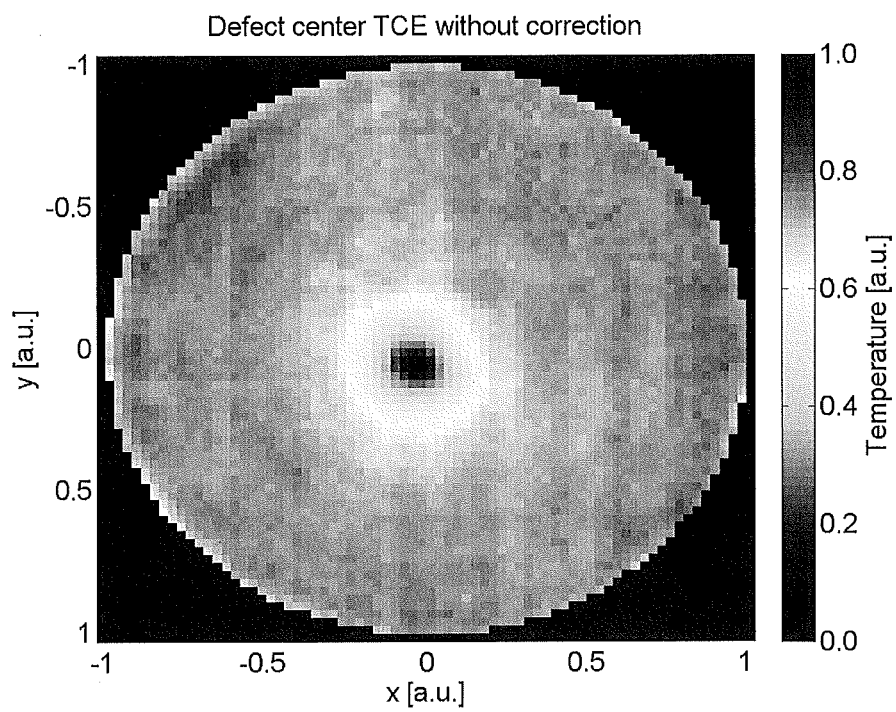

FIG. 3A is thermal image of a substrate support assembly 112 used in an exemplary embodiment. In FIG. 3A, all thermal control elements 114 are functioning properly, and are powered so that the substrate support assembly 112 has a uniform temperature. Temperatures are shown in arbitrary units (a.u.). These units are scaled to best represent the temperature changes. These arbitrary units can be translated into standard temperature units as, but not limited to, Kelvin, Degree Celsius, and Fahrenheit. In a non-limiting embodiment, the total temperature range of the thermal control elements may be 2° C., or 5° C., or 20° C. FIG. 3B shows a thermal image of the same substrate support assembly of FIG. 3A, but illustrates how the temperature profile across the substrate support assembly 112 changes when one thermal control element 114 has failed, and the failed thermal control element 114 has not been compensated for by correction. FIG. 3B shows the impact of a failed thermal control element 114 on the overall temperature distribution and the local temperature change. For example, the temperature in the vicinity of the failed thermal control element 114 is approximately 0.5 a.u. instead of being around 0.82 a.u. as in FIG. 3A. As shown in FIG. 3B, if a thermal control element 114 fails completely, the local thermal uniformity around the location of the failed thermal control element 114 degrades. The thermal degradation leads to spot defects and decreases the chip yield per wafer. Prior to the auto-correction methods described herein, a person would have to accept the yield loss, repair the thermal control element 114, or replace the entire substrate support assembly 112. In contrast, the methods described herein allow for the detection of a failed thermal control element 114 or a group of failed thermal control elements 114, and an auto-correction process is used to correct for the failed thermal control element 114 or the group of failed thermal control elements 114.

Figure 4:
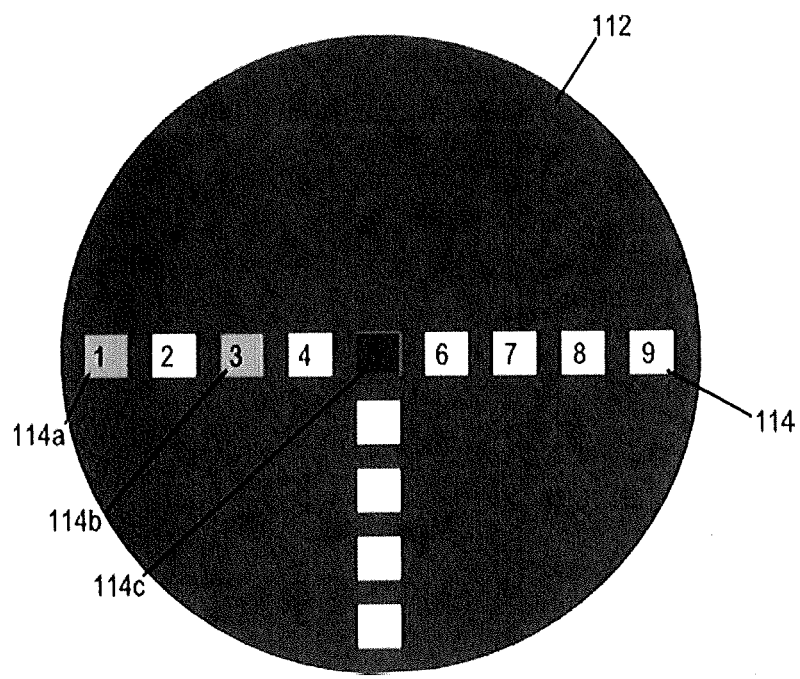
FIG. 4 is a plan view of an exemplary substrate support assembly.

FIG. 4 shows a plan view of an exemplary substrate support assembly 112. The substrate support assembly in FIG. 4 includes an array of thermal control elements 114, and each thermal control element 114 is identified by a unique identifier. In the non-limiting embodiment shown in FIG. 4, the thermal control elements 114 are uniquely identified by a number. However, the thermal control elements 114 can be identified by any other manner (e.g., unique letters, etc.). In the non-limiting embodiment of FIG. 4, the thermal control elements identified as 1, 3, and 5 (114a, 114b, 114c, respectively) are not working properly, i.e. their operation has failed.

FIG. 3B is a thermal image which illustrates the effect of the failed thermal control 114c (i.e., 5) on the thermal uniformity of the substrate support assembly 112, when the failed thermal control element is not compensated for by correction.

FIG. 5A is an exemplary table containing temperature data associated with the failed thermal control elements 114a, 114b, and 114c, when compensation for the failed thermal control elements is not performed. The first row of the table in FIG. 5A shows temperature data of the substrate support assembly 112 when all of the thermal control elements are functioning properly, i.e. there are no failed thermal control elements. When there are no failed thermal control elements, minimum temperature on the substrate support assembly 112 is 0.75 a.u., the mean temperature across the substrate support assembly 112 is 0.82 a.u., the maximum temperature across the substrate support assembly 112 is 0.89 a.u., and the standard deviation is 0.01 a.u.

The second row of the table in FIG. 5A shows temperature data of the substrate support assembly 112 when thermal control element 114a has failed. Under this scenario, the minimum temperature on the substrate support assembly 112 is 0.00 a.u., the mean temperature across the substrate support assembly 112 is 0.80 a.u., the maximum temperature across the substrate support assembly 112 is 0.88 a.u., and the standard deviation is 0.08 a.u.

The third row of the table in FIG. 5A shows temperature data of the substrate support assembly 112 when thermal control element 114b has failed. Under this scenario, the minimum temperature on the substrate support assembly 112 is 0.33 a.u., the mean temperature across the substrate support assembly 112 is 0.80 a.u., the maximum temperature across the substrate support assembly 112 is 0.89 a.u., and the standard deviation is 0.05 a.u.

The fourth and final row of the table in FIG. 5A shows temperature data of the substrate support assembly 112 when thermal control element 114c has failed. Under this scenario, the minimum temperature on the substrate support assembly 112 is 0.50 a.u., the mean temperature across the substrate support assembly 112 is 0.81 a.u., the maximum temperature across the substrate support assembly 112 is 0.89 a.u., and the standard deviation is 0.04 a.u.

Figure 3C:
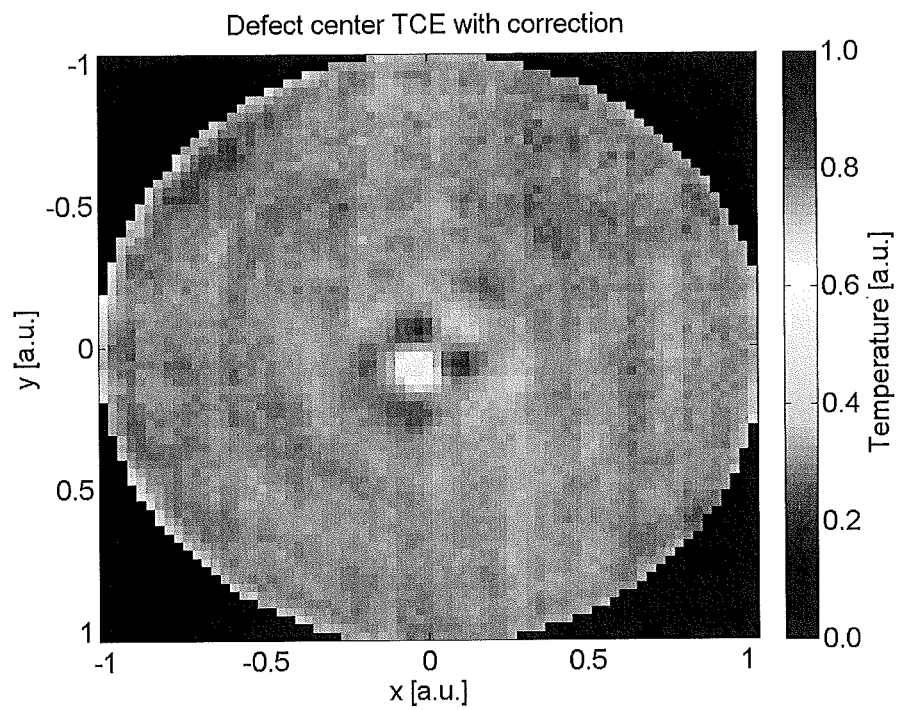

FIG. 3C is a thermal image which illustrates the effect of the failed thermal control element 114c (i.e., 5) on the thermal uniformity of the substrate support assembly 112, when the failed thermal control elements are compensated for by correction. The compensation occurs by adjusting the temperature of other functioning thermal control elements, and will be discussed in greater detail later.

FIG. 5B is an exemplary table containing temperature data associated with the failed thermal control elements 114a, 114b, and, when compensation for the failed thermal control elements is performed. The first row of the table in FIG. 5B shows temperature data of the substrate support assembly 112 when all of the thermal control elements are functioning properly, i.e. there are no failed thermal control elements. When there are no failed thermal control elements, minimum temperature on the substrate support assembly 112 is 0.75 a.u., the mean temperature across the substrate support assembly 112 is 0.82 a.u., the maximum temperature across the substrate support assembly 112 is 0.89 a.u., and the standard deviation is 0.01 a.u.

The second row of the table in FIG. 5B shows temperature data of the substrate support assembly 112 when compensation is performed to correct for the failure of thermal control element 114a. Under this scenario, the minimum temperature on the substrate support assembly 112 is 0.45 a.u., the mean temperature across the substrate support assembly 112 is 0.81 a.u., the maximum temperature across the substrate support assembly 112 is 1.00 a.u., and the standard deviation is 0.02 a.u.

The third row of the table in FIG. 5B shows temperature data of the substrate support assembly 112 when compensation is performed to correct for the failure of thermal control element 114b. Under this scenario, the minimum temperature on the substrate support assembly 112 is 0.62 a.u., the mean temperature across the substrate support assembly 112 is 0.83 a.u., the maximum temperature across the substrate support assembly 112 is 0.92 a.u., and the standard deviation is 0.02 a.u.

The fourth and final row of the table in FIG. 5B shows temperature data of the substrate support assembly 112 when compensation is performed to correct for the failure of thermal control element 114c. Under this scenario, the minimum temperature on the substrate support assembly 112 is 0.71 a.u., the mean temperature across the substrate support assembly 112 is 0.83 a.u., the maximum temperature across the substrate support assembly 112 is 0.89 a.u., and the standard deviation is 0.01 a.u.

Figure 7:
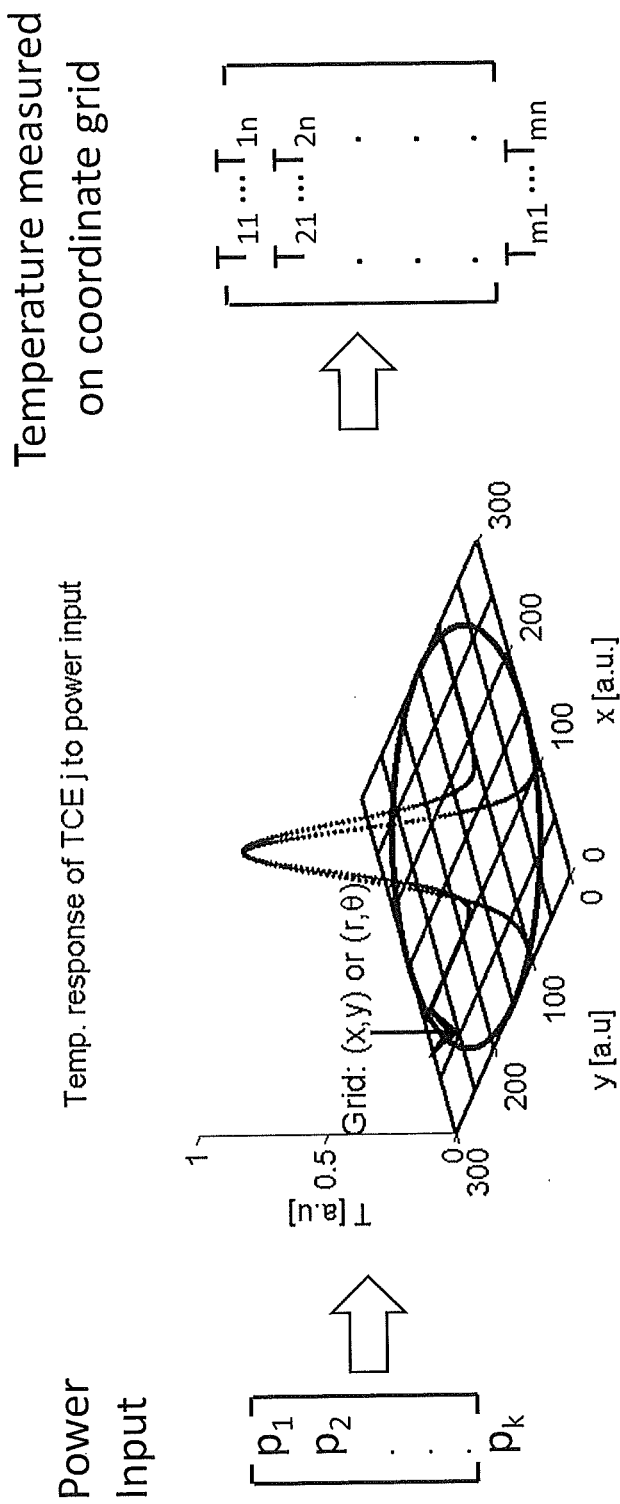
FIG. 7 illustrates an exemplary unit response matrix that may be employed in accordance with an exemplary embodiment.
Figure 8A:
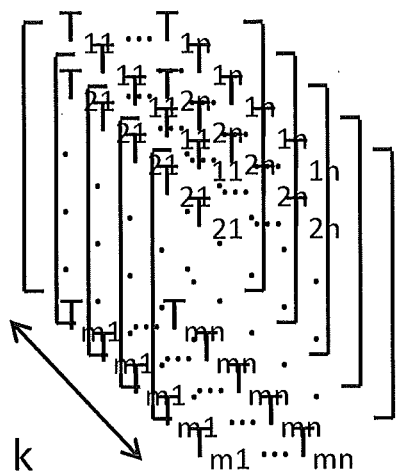
FIGS. 8A-B illustrate exemplary unit response matrices that may be employed in accordance with an exemplary embodiment.
Figure 8B:
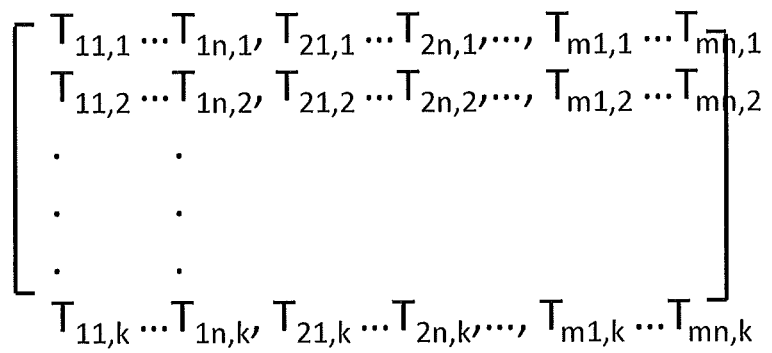

As described above, the power output of a particular thermal control element is calculated and optimized by a given temperature demand, and the relationship between the power output and the temperature is given by a matrix, e.g., a unit response matrix as shown in FIGS. 7, 8A, and 8B. The relationship between the power output and temperature could be represented in other ways than a matrix (e.g., a formula, a table, a list, etc.).

In an exemplary embodiment, compensation of a failed thermal control element 114 or a group of failed thermal control elements 114 is achieved by detecting and deactivating the failed thermal control element or elements 114 and by modifying the parameters in a matrix, e.g., the unit response matrix, which are used to power and adjust the temperatures of the thermal control elements 114 in the substrate support assembly 112. The parameters in the matrix corresponding to surrounding thermal control elements 114 are adjusted to minimize the impact of the failed thermal control element on the overall temperature output. The auto-correction methods described herein can significantly minimize the impact of a failed thermal control element 114. It has been observed that auto-correction works better with a higher number of neighboring thermal control elements 114 and a smaller distance to the nearest neighboring thermal control elements 114.

FIG. 7 illustrates an exemplary unit response matrix for one thermal control element, and the unit response matrix gives a two-dimensional temperature output for a given power input for each of the thermal control elements 114. In other words, the unit response matrix is a functional matrix that relates power input (p) and temperature response (T) of a thermal control element 114. For example, by the equation p=f(URM, T).

The unit response matrix includes the following information: 1) identifies the specific thermal control element 114 that is under consideration (e.g. an identifier, index number, etc.); 2) identifies the spatial location of the thermal control element 114 (row and column number, polar coordinates (i.e., r, θ), etc.); and 3) includes the temperature at that spatial location. The spatial location is an array over all points on the surface of the substrate support assembly 112 to an arbitrary density. For example, out of a 300 mm substrate support assembly 112, there could be a thousand location points, twenty thousand location points, or fifty thousand location points depending on what the measurement density is. In a non-limiting embodiment, linear superposition can be used to reconstruct a full spatial map from the unit response matrix.

In FIG. 7, the power input matrix on the left side of the figure contains multiple power values $p_1, p_2, \ldots p_k$, where k is the number of thermal control elements 114 in the array of the substrate support assembly 112. For example, if the substrate support assembly 112 has 100 thermal control elements, k=100. Each power value $p_1, p_2, \ldots p_k$ in the power input matrix is associated with a power level. In a non-limiting embodiment, a power level could be digitized and there could be 0 through x power levels, where x is any integer value. For example if x=100, there would be 100 discrete power levels (e.g., 0, 1, 2, 3, . . . , 100) that a thermal control element 114 could be set to. Power level 0 could be the lowest possible power level and power level 100 could be the highest possible power level or vice versa. That is, power level 100 can correspond to 100 percent power and power level 0 can correspond to 0 percent power. The power levels above are exemplary, and can be represented in other ways than described above.

The middle portion of FIG. 7 shows a three-dimensional grid which illustrates the temperature response of one thermal control element to power input. In FIG. 7, temperature is shown on the z-axis, and location is shown on the x and y axis. In an exemplary embodiment, all thermal control elements are measured/calculated/modeled with direct measurement. In an exemplary embodiment, the measurement grid is independent of thermal control element 114 location. Also, in an exemplary embodiment, high density measurement of the temperatures of the thermal control elements 114 is performed using a thermal couple (TC), a resistance temperature detector (RTD), an infrared (IR) camera, or any other device for measuring temperature.

In FIG. 7, the temperature output matrix on the right side of the figure contains multiple temperature measurements at various locations within the substrate support assembly 112. For example, in FIG. 7, $T_{11}$ is a temperature value at position x=1 and y=1 within the substrate support assembly 112, and $T_{mn}$ is a temperature value at a position x=m and y=n within the substrate support assembly 112. In other words, the temperature matrix shown in FIG. 7 includes temperature values that are detected at various positions on the surface of the substrate support assembly 112.

FIG. 8A illustrates an exemplary unit response matrix in a three-dimensional representation, and FIG. 8B illustrates an exemplary unit response matrix in a two-dimensional representation. The unit response matrix can be represented in two or three dimensions. For a three-dimensional unit response matrix, all k two-dimensional sub-matrices are added up to a three-dimensional matrix as shown in FIG. 8A. Here, k is the number of thermal control elements 114 in the substrate support assembly 112. For a two-dimensional matrix, each two dimensional sub-matrix is vectorized (2D to 1D) and the vectorized one-dimensional matrices are added up to a two-dimensional matrix.

Figure 6:
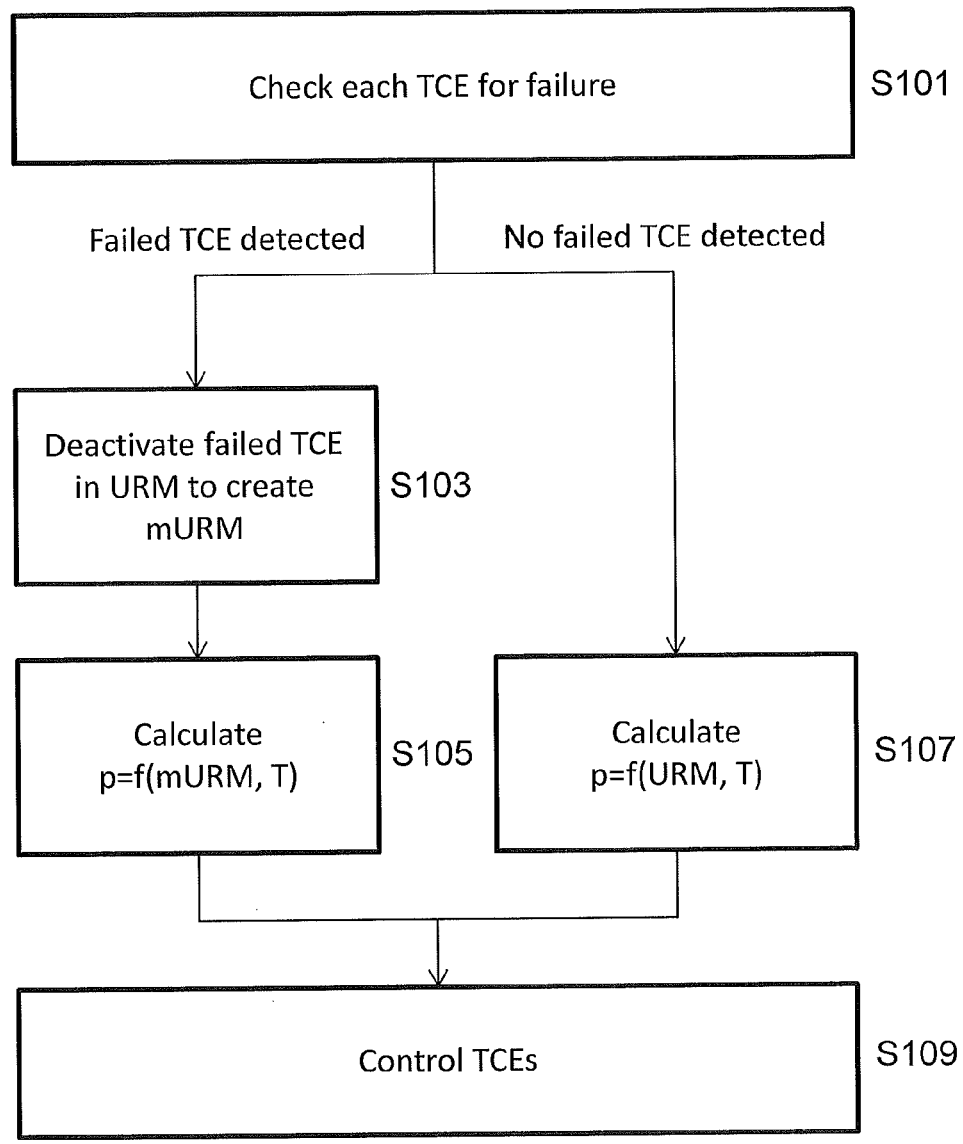
FIG. 6 is a flow chart illustrating an exemplary method of an embodiment.

In an exemplary embodiment, the unit response matrix is modified by setting the column corresponding to the failed thermal control element 114 to zero, and defining a vector T with elements equal to predetermined temperatures (e.g., a uniform 0.82 a.u.). The linear equation $p=f(URM, T_{in})$ is solved for the vector power levels p (e.g., 100 elements) with the unit response matrix, and p is digitized by the available number of power levels (e.g., 100). The new vector p is used to calculate the real temperature output, $T_{out}=f(URM,p)$ FIG. 6 is a flow chart illustrating an exemplary autocorrection method of an embodiment. In step S101, each thermal control element 114 in the substrate support assembly 112 is checked to see if there is one or more abnormally performing or failed thermal control elements 114. In an exemplary embodiment, the one or more abnormally performing or failed thermal control elements 114 are detected by a temperature detector 124. The temperature detector 124 can be, for example, a thermal camera or any other device that can detect temperature. In an exemplary embodiment, the at least one abnormally performing or failed thermal control element 114 is detected by performing electrical monitoring that senses an open circuit, a closed circuit, or an altered state of the at least one abnormally performing or failed thermal control element 114. For example, the power of a thermal control element 114 can be monitored by using the equation $P=I^2*R$, where P is power, I is current, and R is resistance. If the monitored power of a thermal control element 114 shifts unexpectedly or falls out of a predetermined range, it can be determined to be abnormally performing or a failed thermal control element 114. Also, the control unit 116 can monitor each thermal control element 114 in the substrate support assembly 112 to determine whether a thermal control element 114 is in an open circuit failed state, a closed circuit failed state, or any other changes have occurred relative to the expected power output (e.g., in an exemplary method of controlling power, the implementation can be a timed based controlled switching between on and off states rather than controlling constant currents, hereby it can be detected if the system is not in the desired state, e.g. on when it should be in an off state). The thermal control elements 114 can be monitored by measuring the current flowing to each thermal control element 114, measuring resistance with an Ohmmeter, or by using a Joulemeter.

After a failed thermal control element 114 is detected in step S101, the method proceeds to step S103, and if a failed thermal control element 114 is not detected in step S101, the method proceeds to step S107.

In step S103, a failed thermal control element is deactivated by setting the power level in the unit response matrix of the failed thermal control element to zero. Next, the failed thermal control element is compensated for by modifying power levels of other thermal control elements in the unit response matrix to create a modified unit response matrix (mURM). The solution to an arbitrary temperature profile will use modified parameters to resolve the optimal individual thermal control element outputs. In an exemplary embodiment, the same established global optimization routine to calculate a power output without the failed thermal control element or elements is used to create the modified unit response matrix. An advantage of using the same routine for the unit response matrix as the modified unit response matrix is that the routine is already tested thoroughly and results with a full working thermal control element array meet customer expectations. A second advantage is that only one code base has to be maintained. Any future improvement and/or bugfix has only to be programmed and tested once instead of maintaining two code bases.

Another advantage of modifying the parameters and using the same global optimization routine is the robustness of that routine because it is developed and used for all power output calculations.

An alternative approach is a local optimization routine which only uses the nearest neighboring thermal control elements 114 to compensate for a failed thermal control element 114 instead of using all of the thermal control elements 114 in the substrate support assembly 112 (i.e., a global optimization routine). Since the substrate support assembly material has a finite thermal conductivity, the major contribution to compensate for the failed thermal control element 114 is given by the nearest neighboring thermal control elements 114. If a separate optimization algorithm for nearest neighbor compensation is used, it would have to be developed and tested, which could increase the overall cost associated with a substrate support assembly 112, while only gaining an advantage in the case of a failure. This difference in cost could even increase if the routine is optimized in the future.

The modified parameters in the unit response matrix are stored and used instead of the original parameters to power the thermal control elements 114. A copy of the original parameters is stored as well, for example in the memory 118 of the control unit 116, to recover if one failed thermal control element 114 or a group of failed thermal control elements 114 can be reactivated, repaired or replaced. Reducing the number of active thermal control elements 114 might lead to a global spatial temperature profile that is reduced in total range and/or versatility.

The ability to compensate for multiple failed thermal control elements 114 depends on the location of the failed thermal control elements 114. For example, a simultaneous failure of thermal control elements 114 which are nearest neighbors will result in a bigger impact on the temperature profile with, at the same time, less flexibility in compensating for this impact since the major part of the correction is done by the nearest neighboring thermal control elements 114. However, if multiple spatially separated thermal control elements 114 fail, the impact on the global temperature profile is less severe.

In an exemplary embodiment, the impact of failed thermal control elements 114 can be obtained with mathematical methods and communicated to the user, e.g. a process operator. For example, the user is informed about the impact on expected errors and is asked to accept this change, and the specification will be modified. In an exemplary embodiment, the user is only informed whenever a specific profile is out of the originally defined specification and she/he can accept or decline each single case that is out of specification. In an exemplary embodiment, a notification indicating impact of the failed or abnormal thermal control element on the substrate support assembly is transmitted to a device. In an exemplary embodiment, the device can be, for example, a smart phone, laptop, tablet, etc. The device can also be an independent control mechanism of the substrate support assembly, e.g., a computer system. In an exemplary embodiment, the computer system can include a computer algorithm that decides whether the impact is acceptable, or whether the specification should be modified due to the change, and how the specification should be changed as a result of the change.

After the modified unit response matrix is created, power levels for the thermal control elements 114 are calculated using the modified unit response matrix and required temperatures (T) as inputs in step S105. For example, by using the equation p=f(mURM, T). After step S105, the thermal control elements 114 are controlled by the control unit 116 in step S109, by using the power levels for the thermal control elements 114 that were calculated in step S105.

If no failed thermal control elements 114 are detected after step S101, power levels for the thermal control elements 114 are calculated using the unit response matrix (which was not modified) and required temperatures (T) as inputs in step S107. After step S107, the thermal control elements 114 are controlled by the control unit 116 in step S109, using the power levels for the thermal control elements 114 that were calculated in step S107.

Figure 9:
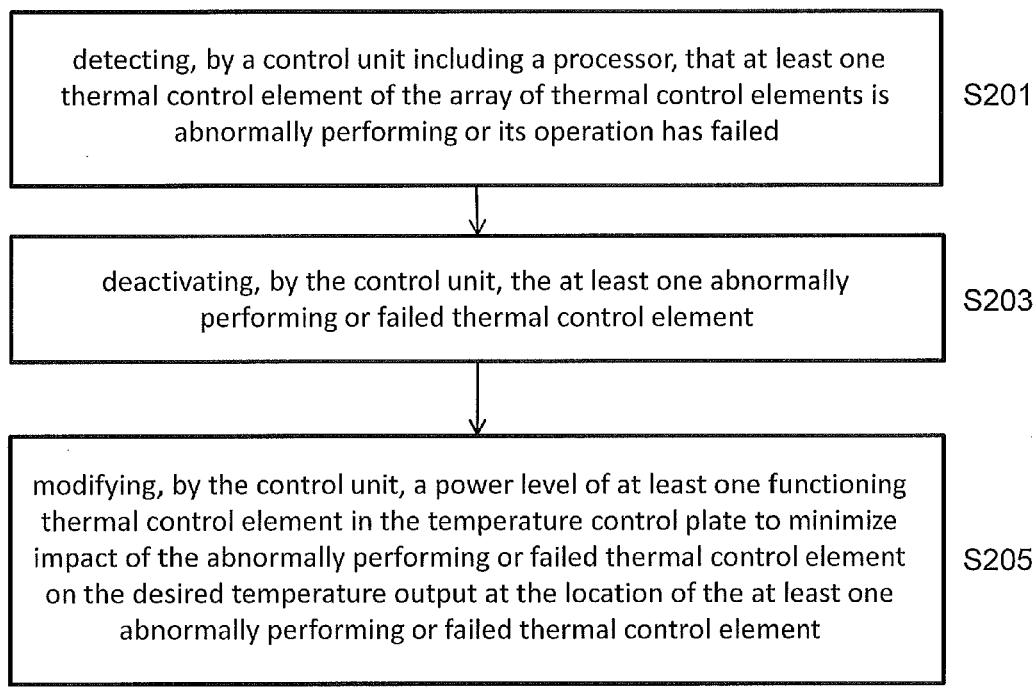
FIG. 9 is a flow chart illustrating an exemplary method of an embodiment.

FIG. 9 illustrates an exemplary method for auto-correction of at least one abnormally performing or failed thermal control element 114 among an array of thermal control elements 114 that are independently controllable and located in a temperature control plate of a substrate support assembly 112 which supports a semiconductor substrate 110 during processing thereof. In an exemplary embodiment, the array includes at least 50 thermal control elements 114 and the temperature control plate is located between a temperature controlled base plate 105 and a dielectric layer 103 containing at least one electrostatic clamping electrode 109, as shown in FIG. 2.

The method includes, in step S201, detecting, by the control unit 116 including the processor 120, that at least one thermal control element 114a of the array of thermal control elements 114 is abnormally performing or its operation has failed. As described above, the abnormally performing or failed thermal control element 114a can be detected, for example, by a temperature detector 124, electrical monitoring, etc.

Step S203 includes deactivating, by the control unit 116, the at least one abnormally performing or failed thermal control element 114a. In an exemplary embodiment, the deactivating is performed by stopping supply of power to the at least one abnormally performing or failed thermal control element 114a. For example, by adjusting the power variable in the unit response matrix corresponding to the abnormally performing or failed thermal control element 114a to be at a zero power level. Alternatively, if the abnormally performing thermal control element is stuck in a closed circuit condition it is always powered on, and this fact can also be compensated for by adjusting other thermal control elements 114 in the substrate support assembly 112.

Step S205 includes modifying, by the control unit 116, a power level of at least one functioning thermal control element 114 in the temperature control plate to minimize impact of the abnormally performing or failed thermal control element 114a on the desired temperature output at the location of the at least one abnormally performing or failed thermal control element 114a. In an exemplary embodiment, the at least one functioning thermal control element 114 that is modified is a thermal control element that is adjacent to the at least one abnormally performing or failed thermal control element 114a. In an exemplary embodiment, the at least one functioning thermal control element 114 that is modified is a plurality of thermal control elements 114 that are within a radius of a predetermined distance to the at least one abnormally performing or failed thermal control element.

In an exemplary embodiment, during the modifying step of S205, a matrix relating power input of a thermal control element 114 to temperature output of the thermal control element 114 is used. The matrix can include, for example, vectors. In an exemplary embodiment, during the modifying step of S205, a unit response matrix is used. For example, a unit response matrix as shown in FIGS. 7, 8A, and 8B can be used.

In an exemplary embodiment, in step S205, instead of modifying a power level of at least one functioning thermal control element 114 in the temperature control plate, the control unit 116 optimizes temperature by not modifying the power levels of any functioning thermal control element 114 in the temperature control plate, to minimize impact of the abnormally performing or failed thermal control element 114 on the desired temperature output at the location of the at least one abnormally performing or failed thermal control element 114. In other words, in certain cases, the optimal solution may be to maintain (and not vary) the power levels of the functioning thermal control elements 114, when the failed thermal control element or elements 114 are in an open circuit state and do not provide any heat to the system.

In an exemplary embodiment, the method of FIG. 9 includes calculating a power input of a thermal control element 114 of the temperature control plate based on a desired temperature output and a matrix relating power input of the thermal control element to temperature output of the thermal control element 114.

An exemplary method includes processing a semiconductor substrate 110 in a plasma processing chamber 122 on which the semiconductor substrate 110 is supported on the substrate support assembly 112 having the thermal control plate with the array of thermal control elements 114 autocorrected by the method described above and shown in FIG. 9. The exemplary method also includes plasma processing the semiconductor substrate 110 while controlling a radial and azimuthal temperature profile across the semiconductor substrate 110. In an exemplary embodiment, the plasma processing includes plasma etching.

In an exemplary embodiment, a non-transitory computer readable storage medium (e.g., a RAM, ROM, DVD, Blu-Ray Disc, etc.), stores instructions, which when executed by a processor (CPU, etc.), performs the auto-correction methods described above.

The substrate support assembly can have various arrangements of heater/cooler zones which are heated/cooled by the thermal control elements 114. See for example, commonly-assigned U.S. Published Applications 2011/0092702, 2012/0115254, 2012/0068750, 2013/0072035, 2013/0220989, 2013/0270250, 2014/0048529, 2014/0110060, and 2014/0047705 all of which are hereby incorporated by reference in their entirety.

While various exemplary embodiments of the disclosed methods have been described above, it should be understood that they have been presented for purposes of example only, not limitations. It is not exhaustive and does not limit the disclosure to the precise form disclosed. Modifications and variations are possible in light of the above teachings or may be acquired from practicing of the disclosure, without departing from the breadth or scope.

What is claimed is:

1. A method for auto-correction of at least one malfunctioning thermal control element among an array of thermal control elements that are independently controllable and located in a temperature control plate of a substrate support assembly which supports a semiconductor substrate during processing thereof, the method comprising:
   detecting, by a control unit including a processor, that at least one thermal control element of the array of thermal control elements is malfunctioning;
   deactivating, by the control unit, the at least one malfunctioning thermal control element; and
   modifying, by the control unit, a power level of at least one functioning thermal control element in the temperature control plate to minimize impact of the malfunctioning thermal control element on the desired temperature output at the location of the at least one malfunctioning thermal control element,
   wherein the at least one malfunctioning thermal control element is detected by performing electrical monitoring that senses an open circuit, a closed circuit, or an altered state of the at least one malfunctioning thermal control element.

2. A method for auto-correction of at least one malfunctioning thermal control element among an array of thermal control elements that are independently controllable and located in a temperature control plate of a substrate support assembly which supports a semiconductor substrate during processing thereof, the method comprising:
   detecting, by a control unit including a processor, that at least one thermal control element of the array of thermal control elements is malfunctioning;
   deactivating, by the control unit, the at least one malfunctioning thermal control element; and
   modifying, by the control unit, a power level of at least one functioning thermal control element in the temperature control plate to minimize impact of the malfunctioning thermal control element on the desired temperature output at the location of the at least one malfunctioning thermal control element,
   wherein the array includes at least 50 thermal control elements and the temperature control plate is located between a temperature controlled base plate and a dielectric layer containing at least one electrostatic clamping electrode.

3. The method of claim 1, wherein the deactivating is performed by stopping supply of power to the at least one malfunctioning thermal control element.

4. The method of claim 1, wherein the at least one functioning thermal control element that is modified is a thermal control element that is adjacent to the at least one malfunctioning thermal control element.

5. The method of claim 1, wherein during the modifying, a matrix relating power input of a thermal control element to temperature output of the thermal control element is used.

6. The method of claim 5, wherein the matrix includes vectors.

7. The method of claim 1, further comprising:
   calculating a power input of a thermal control element of the temperature control plate based on a desired temperature output and a matrix relating power input of the thermal control element to temperature output of the thermal control element.

8. The method of claim 1, wherein during the modifying, a unit response matrix is used.

9. A non-transitory computer readable storage medium, storing instructions, which when executed by a processor, performs a method of performing auto-correction for at least one malfunctioning thermal control element among an array of thermal control elements that are independently controllable and located in a temperature control plate of a substrate support assembly which supports a semiconductor substrate during processing thereof, the method comprising:
   detecting that at least one thermal control element of the array of thermal control elements is malfunctioning;
   deactivating the at least one malfunctioning thermal control element; and
   modifying a power level of at least one functioning thermal control element in the temperature control plate to minimize impact of the malfunctioning thermal control element on the desired temperature output at the location of the at least one malfunctioning thermal control element,
   wherein the at least one malfunctioning thermal control element is detected by performing electrical monitoring that senses an open circuit, a closed circuit, or an altered state of the at least one malfunctioning thermal control element.

10. A non-transitory computer readable storage medium, storing instructions, which when executed by a processor, performs a method of performing auto-correction for at least one malfunctioning thermal control element among an array of thermal control elements that are independently controllable and located in a temperature control plate of a substrate support assembly which supports a semiconductor substrate during processing thereof, the method comprising:

detecting that at least one thermal control element of the array of thermal control elements is malfunctioning;

deactivating the at least one malfunctioning thermal control element; and modifying a power level of at least one functioning thermal control element in the electrostatic chuck to minimize impact of the malfunctioning thermal control element on the desired temperature output at the location of the at least one malfunctioning thermal control element, wherein the array includes at least 50 thermal control elements and the temperature control plate is located between a temperature controlled base plate and a dielectric layer containing at least one electrostatic clamping electrode.

11. The non-transitory computer readable storage medium of claim 9, wherein the deactivating is performed by stopping supply of power to the at least one malfunctioning thermal control element.

12. The non-transitory computer readable storage medium of claim 9, wherein the at least one functioning thermal control element that is modified is a thermal control element that is adjacent to the at least one malfunctioning thermal control element.

13. The non-transitory computer readable storage medium of claim 9, wherein during the modifying, a matrix relating power input of a thermal control element to temperature output of the thermal control element is used.

14. The non-transitory computer readable storage medium of claim 13, wherein the matrix includes vectors.

15. The non-transitory computer readable storage medium of claim 9, the method further comprising:

calculating a power input of a thermal control element of the substrate support assembly based on a desired temperature output and a matrix relating power input of the thermal control element to temperature output of the thermal control element.

16. The non-transitory computer readable storage medium of claim 9, wherein during the modifying, a unit response matrix is used.

17. A method of processing a semiconductor substrate in a processing chamber on which a semiconductor substrate is supported on the substrate support assembly having the thermal control plate with the array of thermal control elements auto-corrected by the method recited in claim 1, the method comprising:

processing the semiconductor substrate while controlling a radial and azimuthal temperature profile across the semiconductor substrate.

18. The method of claim 17, wherein the processing comprises plasma etching.

19. The method of claim 17, wherein the processing comprises deposition processes.

20. The method of claim 17, wherein the processing comprises cleaning processes.

21. A method for auto-correction of at least one malfunctioning thermal control element among an array of thermal control elements that are independently controllable and located in a temperature control plate of a substrate support assembly which supports a semiconductor substrate during processing thereof, the method comprising:

detecting, by a control unit including a processor, that at least one thermal control element of the array of thermal control elements is malfunctioning;

deactivating, by the control unit, the at least one malfunctioning thermal control element; and maintaining, by the control unit, power levels of all functioning thermal control elements in the temperature control plate to minimize impact of the malfunctioning thermal control element on the desired temperature output at the location of the at least one malfunctioning thermal control element, wherein the at least one malfunctioning thermal control element is detected by performing electrical monitoring that senses an open circuit, a closed circuit, or an altered state of the at least one malfunctioning thermal control element.

22. The method of claim 1, wherein a notification indicating impact of the malfunctioning thermal control element on the substrate support assembly is transmitted to a device.

* * * * *